United States Patent
Sun et al.

(10) Patent No.: US 11,237,437 B2
(45) Date of Patent: Feb. 1, 2022

(54) DISPLAY PANEL AND MANUFACTURE METHOD THEREOF, AND DISPLAY APPARATUS

(71) Applicants: BOE TECHNOLOGY GROUP CO., LTD., Beijing (CN); ORDOS YUANSHENG OPTOELECTRONICS CO., LTD., Ordos (CN)

(72) Inventors: Le Sun, Beijing (CN); Wei Zhang, Beijing (CN); Wulijibaier Tang, Beijing (CN); Zhengwen Pan, Beijing (CN); Tianlei Shi, Beijing (CN); Xiaojie Wang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 748 days.

(21) Appl. No.: 16/080,119

(22) PCT Filed: Jan. 15, 2018

(86) PCT No.: PCT/CN2018/072560
§ 371 (c)(1),
(2) Date: Aug. 27, 2018

(87) PCT Pub. No.: WO2019/000912
PCT Pub. Date: Jan. 3, 2019

(65) Prior Publication Data
US 2021/0191201 A1    Jun. 24, 2021

(30) Foreign Application Priority Data
Jun. 27, 2017    (CN) .......................... 201720762032.4

(51) Int. Cl.
*G02F 1/1362*    (2006.01)
*G02F 1/1333*    (2006.01)
(Continued)

(52) U.S. Cl.
CPC .... *G02F 1/136204* (2013.01); *G02F 1/13338* (2013.01); *G02F 1/133388* (2021.01);
(Continued)

(58) Field of Classification Search
CPC ......... G02F 1/136204; G02F 1/133388; G02F 1/13338; G02F 1/133512; G02F 1/1339;
(Continued)

(56) References Cited

U.S. PATENT DOCUMENTS 7,969,537 B2    6/2011  Pan
9,329,427 B2    5/2016  Lou
(Continued)

FOREIGN PATENT DOCUMENTS

CN    101393343 A    3/2009
CN    103645576 A    3/2014
(Continued)

OTHER PUBLICATIONS

International Search Report and Written Opinion dated Apr. 12, 2018; PCT/CN2018/072560.

*Primary Examiner* — Julie Anne Watko

(57) ABSTRACT

A display panel and a manufacture method thereof, and a display apparatus are provided. The display panel includes a first substrate and a second substrate which arranged opposite to each other. The first substrate includes a display region and a peripheral region, a conduction section is in the peripheral region of the first substrate, and the conduction section is electrically connected with a grounded section. The second substrate includes a display region and a peripheral region, a black matrix is at least in the peripheral region (Continued)

of the second substrate, and the black matrix is electrically connected with the conduction section.

20 Claims, 6 Drawing Sheets

(51) Int. Cl.
*G02F 1/1335* (2006.01)
*G06F 3/041* (2006.01)
*H01L 27/32* (2006.01)
*H01R 13/6461* (2011.01)
*H01L 51/00* (2006.01)
*G02F 1/1339* (2006.01)
*G02F 1/1368* (2006.01)
*G06F 3/044* (2006.01)
*H01L 21/02* (2006.01)
*H01L 23/538* (2006.01)
*H01S 5/02* (2006.01)

(52) U.S. Cl.
CPC ...... *G02F 1/133512* (2013.01); *G06F 3/0412* (2013.01); *H01L 27/3253* (2013.01); *H01L 51/0096* (2013.01); *G02F 1/1339* (2013.01); *G02F 1/1368* (2013.01); *G02F 2201/48* (2013.01); *G06F 3/044* (2013.01); *G06F 2203/04107* (2013.01); *H01L 21/02367* (2013.01); *H01L 23/5385* (2013.01); *H01R 13/6461* (2013.01); *H01S 5/0216* (2013.01)

(58) Field of Classification Search
CPC ............ G02F 1/1368; G02F 2201/48; G02F 2202/22; G02F 1/1345; G06F 3/0412; G06F 3/044; G06F 2203/04107; H01L 21/02367; H01L 23/5385; H01L 27/3253; H01L 51/0096; H01S 5/0216
See application file for complete search history.

(56) References Cited

U.S. PATENT DOCUMENTS

| | | | |
|---|---|---|---|
| 2009/0079917 A1* | 3/2009 | Pan | G02F 1/136204 349/110 |
| 2009/0310052 A1* | 12/2009 | Huang | G02F 1/13452 349/40 |
| 2013/0187865 A1* | 7/2013 | Kuo | G02F 1/13338 345/173 |
| 2015/0212366 A1* | 7/2015 | Lou | G02F 1/133512 349/106 |
| 2016/0187718 A1* | 6/2016 | Shin | H01L 27/1262 349/110 |
| 2018/0188571 A1 | 7/2018 | Wang | |
| 2020/0203336 A1* | 6/2020 | Ren | H01L 23/60 |

FOREIGN PATENT DOCUMENTS

| | | | |
|---|---|---|---|
| CN | 1103941465 A | 7/2014 | |
| CN | 105652545 A | 6/2016 | |
| CN | 105807482 A | 7/2016 | |
| CN | 206833100 U | 1/2018 | |
| KR | 1020160032751 A | 3/2016 | |
| WO | WO-2018074867 A1 * | 4/2018 | ........... G02F 1/1335 |

* cited by examiner display region peripheral region display region peripheral region display region peripheral region

DISPLAY PANEL AND MANUFACTURE METHOD THEREOF, AND DISPLAY APPARATUS

The present application claims the priority of Chinese patent application No. 201720762032.4 filed on Jun. 27, 2017, and the entire content disclosed by the Chinese patent application is incorporated herein by reference as part of the present application.

TECHNICAL FIELD

At least one embodiment of the present disclosure relates to a display panel and a manufacture method thereof, and a display apparatus.

BACKGROUND

Touch screens, also known as touch panels, have been widely used in various electronic products and widely accepted by consumers. An embedded capacitive touch screen integrates a touch electrode structure into a display screen and has advantages of simple structure, lightness, thinness and low cost. The embedded capacitive touch screen is increasingly becoming a mainstream technology of the touch screen and is more and more widely used in various portable intelligent terminals (such as a mobile phone). The embedded capacitive touch screen can be classified into an On-Cell touch screen and an In-Cell touch screen. The In-Cell touch screen can be classified into a hybrid in-cell (HIC) capacitive touch screen and a full in-cell (FIC) capacitive touch screen.

SUMMARY

At least one embodiment of the present disclosure provides a display panel and a manufacture method thereof, and a display apparatus. At least one embodiment of the present disclosure provides a display panel, comprising a first substrate and a second substrate, arranged opposite to each other. The first substrate comprises a display region and a peripheral region, a conduction section is in the peripheral region of the first substrate, and the conduction section is electrically connected with a grounded section. The second substrate comprises a display region and a peripheral region, a black matrix is at least in the peripheral region of the second substrate, and the black matrix is electrically connected with the conduction section.

For example, in a display panel provided by an embodiment of the present disclosure, the conduction section comprises at least one first conductive layer, and the first conductive layer is respectively in a same layer as a conductive layer in the display region of the first substrate.

For example, in a display panel provided by an embodiment of the present disclosure, a thickness of the first conductive layer in the peripheral region of the first substrate is greater than a thickness of the conductive layer, which is in a same layer as the first conductive layer, in the display region of the first substrate, and the first conductive layer is electrically connected with the black matrix.

For example, in a display panel provided by an embodiment of the present disclosure, the conductive layer in the display region of the first substrate comprises a light shielding layer, and the first conductive layer is in a same layer as the light shielding layer.

For example, in a display panel provided by an embodiment of the present disclosure, a thin film transistor is in the display region of the first substrate, the thin film transistor comprises a gate electrode and a source/drain electrode, and the first conductive layer is in a same layer as a metal layer where the source/drain electrode is located.

For example, in a display panel provided by an embodiment of the present disclosure, the conduction section further comprises an insulating layer and a second conductive layer. The insulating layer covers the first conductive layer, the second conductive layer is electrically connected with the first conductive layer through at least one via hole in the insulating layer, and the second conductive layer is electrically connected with the black matrix.

For example, in a display panel provided by an embodiment of the present disclosure, the first substrate further comprises a pixel electrode, and the second conductive layer is in a same layer as the pixel electrode; or the first substrate further comprises a common electrode, and the second conductive layer is in a same layer as the common electrode.

For example, in a display panel provided by an embodiment of the present disclosure, the black matrix is further in the display region of the second substrate, and a thickness of the black matrix in the peripheral region of the second substrate is greater than a thickness of the black matrix in the display region of the second substrate.

For example, in a display panel provided by an embodiment of the present disclosure, the conduction section is around the peripheral region of the first substrate and forms an enclosed shape, a portion of the black matrix in the peripheral region of the second substrate forms another enclosed shape, and the conduction section is in contact with the black matrix.

For example, in a display panel provided by an embodiment of the present disclosure, the second substrate further comprises a planarization layer in the display region of the second substrate, the planarization layer covers the black matrix in the display region of the second substrate, and the thickness of the black matrix in the peripheral region of the second substrate is equal to a sum of the thickness of the black matrix in the display region of the second substrate and a thickness of the planarization layer.

For example, a display panel provided by an embodiment of the present disclosure further comprises a sealant, and the sealant is on a side of the conduction section facing the display region of the first substrate.

For example, a display panel provided by an embodiment of the present disclosure further comprises a conductive adhesive, and the conduction section is electrically connected with the grounded section via the conductive adhesive.

For example, a display panel provided by an embodiment of the present disclosure is a full in-cell capacitive touch screen.

At least one embodiment of the present disclosure further provides a display apparatus, comprising the display panel provided by the embodiments of the present disclosure.

For example, a display apparatus provided by an embodiment of the present disclosure further comprises a metal frame, and the grounded section is the metal frame.

For example, at least one embodiment of the present disclosure further provides a manufacture method of a display panel, comprising providing a first substrate, providing a second substrate and arranging the second substrate opposite to the first substrate. The first substrate comprises a display region and a peripheral region, a conduction section is in the peripheral region of the first substrate, and the conduction section is electrically connected with a grounded section. The second substrate comprises a display region and a peripheral region, a black matrix is at least in the peripheral area of the second substrate, and the black matrix is electrically connected with the conduction section.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
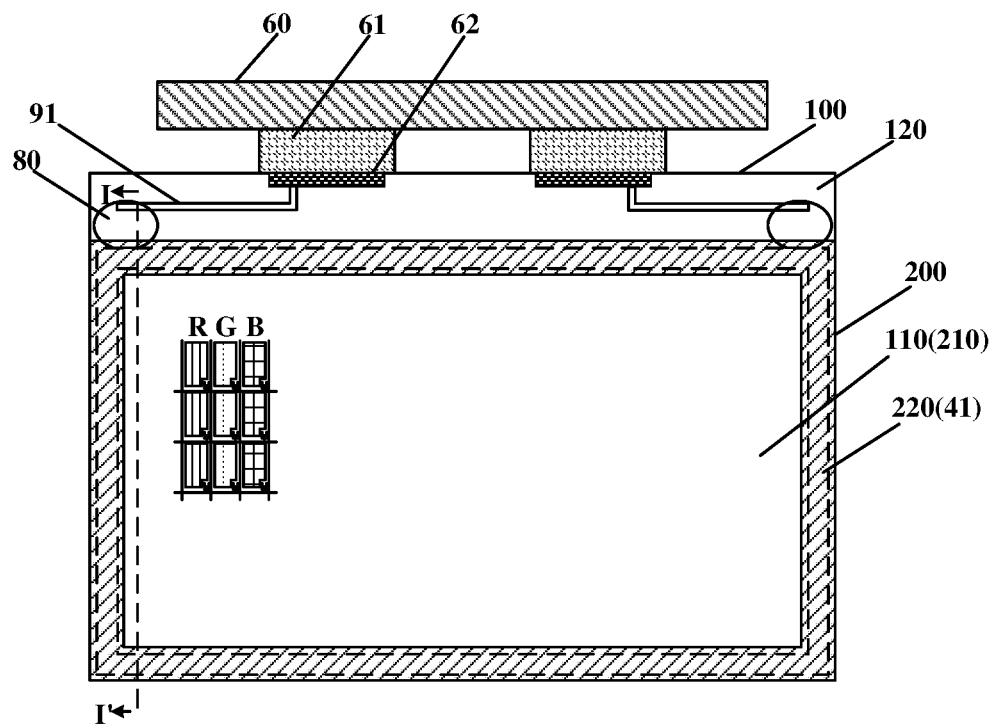
FIG. 1A is a schematic top view of a display panel adopting a GOA mode according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An FIC touch screen adopts a single-layer touch wiring design and adopts a self-capacitance principle. For the FIC touch screen, a touch function is implemented by means of forming a capacitor between a finger and a metal layer inside the panel which plays a touch function. Based on this mechanism, the surface of a color film substrate can no longer be provided with any metal layer, so as not to affect or even completely shield the touch function. Therefore, at present, the surface of the color film substrate of the FIC product has no way of releasing static electricity, and its anti-ESD (Electro-Static Discharge) ability is weak, and the static electricity is difficult to be discharged. However, ESD can cause performance of a device to be degraded and even break down a device and cause a permanent damage to the device.

In addition, because a material of a black matrix material on a side of the color film substrate has a low resistivity, the resistance is in a mega-ohm range, and the static electricity is generally concentrated on the black matrix, which can cause a panel to display abnormally. In addition, static electricity is easily imported in a gap between the color film substrate and the array substrate, thereby breaking down the circuit on the side of the array substrate, and causing the panel to display abnormally.

At least one embodiment of the present disclosure provides a display panel. The display panel includes a first substrate and a second substrate, and the first substrate and the second substrate are arranged opposite to each other. The first substrate includes a display region and a peripheral region, a conduction section is in the peripheral region of the first substrate, and the conduction section is electrically connected with a grounded section. The second substrate includes a display region and a peripheral region, a black matrix is at least in the peripheral region of the second substrate, and the black matrix is electrically connected with the conduction section. At least one embodiment of the present disclosure further provides a method of manufacturing the above display panel and a display apparatus including the above display panel.

The display panel provided by an embodiment of the present disclosure can discharge the static electricity accumulated by the black matrix layer, thereby preventing the static electricity from affecting a display effect of the display panel or even damaging the display panel (for example, a full in-cell capacitive touch screen).

It should be noted that, in the embodiment of the present disclosure, the display region and the peripheral region of the first substrate are regions on a side of the first substrate facing the second substrate, and the display region and the peripheral region of the second substrate are regions on a side of the second substrate facing the first substrate.

In addition, in the embodiment of the present disclosure, a conductive adhesive is an adhesive having a conductive property after curing or drying. Generally, the composition of the conductive adhesive can include matrix resin, conductive particles, dispersing additives, auxiliary material, etc. The conductive adhesive bonds the conductive particles together by means of a bonding function of the matrix resin, and to form a conductive path and implement an electrical connection between the materials that are bonded.

In addition, the embodiment of the present disclosure does not limit the position and connection relationship between the grounded section and the first substrate or the second substrate. Any member in the display panel that can discharge the static electricity on the conduction section electrically connected with the black matrix to release the static electricity can be taken as the grounded section in the embodiment of the present disclosure. It should be noted that the grounded section is not limited to be connected with the ground. For example, a metal frame of a display apparatus can be used as the grounded section, and the static electricity is released when the static electricity is discharged to the metal frame. Of course, when the display apparatus is connected to a three-phase power, the metal frame is connected with the ground, and the static electricity can also be discharged through the ground.

The embodiments of the present disclosure can be applied to various kinds of display panels such as a liquid crystal display panel, an OLED (Organic Light Emitting Diode) display panel and the like. The following embodiments are mainly described by taking a liquid crystal display panel as an example.

The package or encapsulating methods of the liquid crystal display panel include COG (chip on glass, connecting a chip and a glass substrate by a conductor), COB (chip on board, connecting a bare chip to a printed circuit board with a wire directly), COF (chip on film) and the like. A gate driving method of the liquid crystal display apparatus can adopt a GOA (gate driver on array) and the like. The embodiments of the present disclosure are not limited to the manner in which these driver chips or driver circuits are arranged.

The embodiments of the present disclosure will be described in detail below with reference to the accompanying drawings.

Figure 1B:
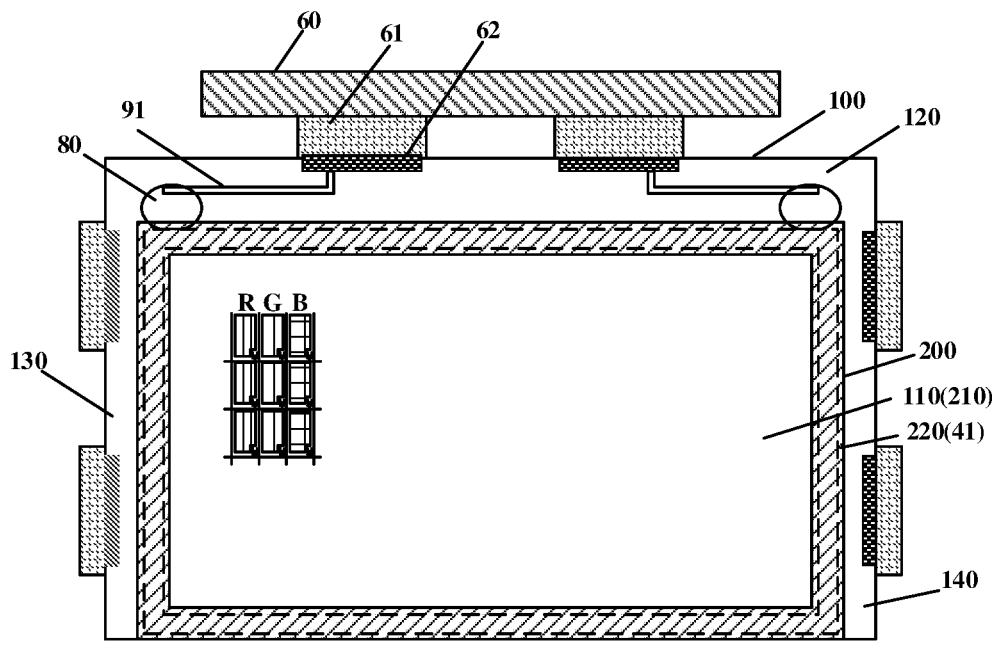
FIG. 1B is a schematic top view of a display panel adopting a COF mode according to an embodiment of the present disclosure.

FIG. 1A is a schematic top view of a display panel adopting a GOA mode according to an embodiment of the present disclosure. FIG. 1B is a schematic top view of a display panel adopting a COF mode according to an embodiment of the present disclosure.

Figure 2:
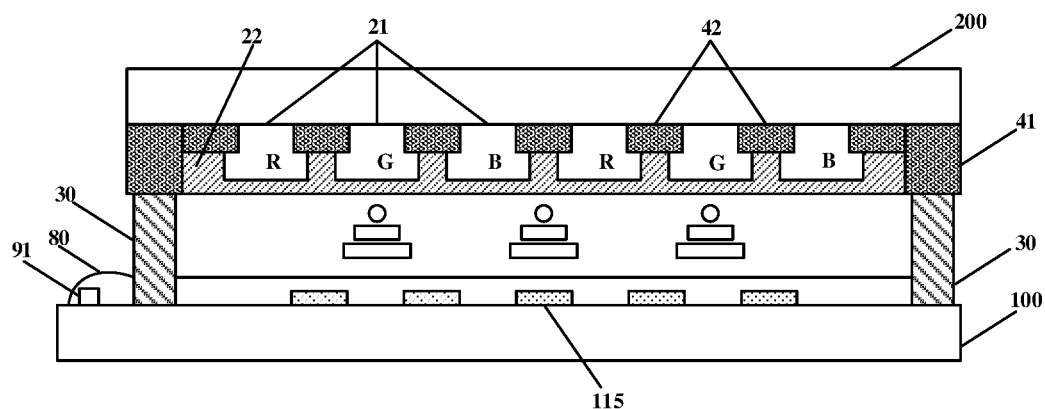
FIG. 2 is a cross-sectional view taken along line I-I' of FIG. 1A.

At least one embodiment of the present disclosure provides a display panel, as shown in FIG. 1A and FIG. 2 (FIG. 2 is a cross-sectional view taken along line I-I' of FIG. A), and the display panel includes a first substrate 100 and a second substrate 200 which are disposed opposite to each other.

For example, the first substrate 100 can be an array substrate, and the side of the first substrate 100 facing the second substrate 200 includes a display region 110 and a peripheral region 120. A conduction section 30 and a grounded section (for example, a printed circuit board 60) are disposed in the peripheral region 120 of the first substrate 100, and the conduction section 30 is electrically connected with the grounded section. It should be noted that, FIG. 2 only exemplarily shows some layers on the first substrate 100. For example, the first substrate 100 can further include other layer for such as TFT (Thin Film Transistor) and the like, and this is not specifically shown in FIG. 2.

For example, the second substrate 200 is an opposite substrate, which can be, for example, a color film substrate, and the side of the second substrate 200 facing the first substrate 100 includes a display region 210 and a peripheral region 220. An orthographic projection of the display region 210 of the second substrate 200 on the first substrate 100 coincides with the display region 110 of the first substrate 100. A black matrix is at least in the peripheral region 220 of the second substrate 200, as shown by the reference numeral 41 in FIG. 2, the black matrix 41 is electrically connected with the conduction section 30. For example, the black matrix 41 can be electrically connected with the conduction section 30 by direct contact, and the black matrix 41 in the peripheral region 220 of the second substrate 200 can be used to block ambient light. It should be noted that, black matrix can also be disposed in the display region 210 of the second substrate 200, as shown by reference numeral 42 in FIG. 2, the black matrix 42 can be used to block scattered light of a liquid crystal layer, and prevent a color cross-talk between sub-pixels and prevent the ambient light illuminating a TFT channel. It should be noted that, the black matrix 42 in the display region 210 of the second substrate 200 is not shown in FIG. 1A and FIG. 1B, and the material of the black matrix can adopt an organic material, for example, a black acrylic resin (mainly mixed by carbon black).

For example, as shown in FIG. 1A and FIG. 2, the display region 210 of the second substrate 200 can further be disposed with a color filter layer 21, a planarization layer 22 and the like, and the color filter layer 21 generally includes a plurality of red sub-pixels R, a plurality of green sub-pixels G and a plurality of blue sub-pixels B. It should be noted that only a part of the sub-pixels of the second substrate are shown in FIG. 1A, FIG. 1B and FIG. 2.

As shown in FIG. 2, the conduction section 30 and the black matrix 41 in the peripheral region 220 of the second substrate can be electrically connected by direct contact, for example, the conduction section 30 and the black matrix 41 can be closely bonded to achieve an electrical connection by direct immediate contact in a cell process.

In at least one embodiment of the present disclosure, the conduction section 30 includes at least one first conductive layer, the first conductive layer is in the same layer as a conductive layer in the display region 110 of the first substrate 100, and the thickness of the first conductive layer is greater than the thickness of the conductive layer, which is in a same layer as the first conductive layer, in the display region 110 of the first substrate 100. The first conductive layer is electrically connected with the black matrix 41 in the peripheral region of the second substrate, for example, the electrical connection can be achieved by direct contact.

In an example of an embodiment of the present disclosure, as shown in FIG. 2, a light shielding layer 115 is on a glass substrate of the display region 110 of the first substrate 100. For example, the light shielding layer 115 can be directly disposed on the glass substrate of the display region 110 of the first substrate 100, and can be used to shield the channel region and prevent a backlight from affecting the channel region. The light shielding layer 115 is made of a metal material, for example, metal molybdenum, and the present embodiment includes but is not limited thereto.

When the light shielding layer 115 is formed in the display region 110 of the first substrate 100, the first conductive layer can be simultaneously formed in the peripheral region 120 of the first substrate 100 by adopting same one patterning process, for example, a gray mask process can be adopted, which enables that the thickness of the first conductive layer in the peripheral region 120 of the first substrate 100 is greater than the thickness of the light shielding layer 115 in the display region 110 of the first substrate 100. The light shielding layer 115 can serve as the corresponding conductive layer of the first conductive layer in the display region 110 of the first substrate 100.

It should be noted that, FIG. 1A and FIG. B are top views. Because the conduction section 30 is below the black matrix 41, the conduction section 30 cannot be shown directly, and the region where the conduction section 30 can be disposed is indicated by a broken line frame in FIG. 1A and FIG. 1B. The conduction section in the present embodiment is disposed at least in the region where one side of the peripheral region of the first substrate is located. For example, the conduction section can be disposed only in one region where one side of the peripheral region of the first substrate is located, and for example, the conduction section can be disposed in two or more regions where two or more sides of the peripheral region are located, that is, it is only necessary to provide a conduction section in the peripheral region of the first substrate to achieve the electrical connection with the black matrix.

For example, in one example of an embodiment of the present disclosure, as shown in FIG. 1A and FIG. 1B, a data signal input side of the first substrate 100 is provided with a printed circuit board 60, and ends of the signal lines provided on the first substrate 100 are connected with the printed circuit board 60 through electrode pins 62 and a flexible circuit film 61. It should be noted that the connection relationship between the signal lines and the electrode pins is not shown in FIG. 1A and FIG. B. Because the static electricity on the black matrix can be released through the printed circuit board 60, the grounded section can be the printed circuit board 60.

As shown in FIG. 1A, FIG. 1B and FIG. 2, the conduction section 30 can be electrically connected with the printed circuit board 60 through a conductive adhesive 80 and a wire 91. The electrical connection between the conduction section 30 and the wire 91 is implemented by dropping the conductive adhesive 80 between the conduction section 30 and the wire 91. In an embodiment of the present disclosure, the conductive adhesive 80 can be dropped by an automatic dispensing device. Due to a surface tension, the conductive adhesive 80 is formed into an elliptical shape and is infiltrated and spread into the conduction section 30 and the wire 91, thereby implementing the electrical connection between the conduction section 30 and the wire 91. The wire 91 is connected with the electrode pin 62, and thereby implementing an electrical connection of the conduction section 30 and the printed circuit board 60. Because the static electricity on the black matrix can be released through the printed circuit board 60 which is electrically connected with the conduction section 30, the grounded section can be the printed circuit board 60.

In addition, as shown in FIG. 1A and FIG. B, a flexible circuit film 61 is further disposed between the electrode pin 62 and the printed circuit board 60. The flexible circuit film 61 adopts a flexible circuit board as a carrier of a chip, and bonding the chip and the flexible circuit board. During a packaging process, the flexible circuit film 61 can be bent, so that the printed circuit board 60 can be located on a side of the first substrate away from the second substrate, and then the first substrate and the second substrate are fixed by a sealant frame.

It should be noted that, FIG. 1A, FIG. 1B, and FIG. 2 only exemplarily show the case of the conductive adhesive being dropped, and the shape of the conductive adhesive does not reflect its true scale.

In the embodiment of the present disclosure, the number of peripheral regions included in the first substrate is different according to the packaging manner or the driving manner of the liquid crystal display panel. For example, the display panel as shown in FIG. 1A adopts a GOA mode, and one cutting line of the first substrate 100 is provided beyond a cutting line of the second substrate 200 corresponding to the cutting line of the first substrate 100, that is, the first substrate 100 includes one peripheral region 120. Of course, the first substrate 100 can also include a plurality of peripheral regions. For example, the display panel as shown in FIG. 1B adopts a COF mode, the first substrate 100 is driven by a double gate driver, and thus the first substrate 100 includes two peripheral regions 130 and 140 in addition to the peripheral region 120. The conductive adhesive 80 can be located in at least one or a combination of the three peripheral regions.

In at least one embodiment, the conductive adhesive 80 can be disposed on a side of the first substrate 100 on which the printed circuit board 60 is disposed along the plane in which it is located, that is, on the side where the peripheral region 120 is located in FIG. 1A and FIG. 1B. The conductive adhesive 80 is disposed on the side where the printed circuit board 60 is located, compared to the other side disposed on the first substrate, the length of the wire 91 can be reduced, thereby reducing the electrical resistance of the wire 91. For example, in FIG. 1B, the conductive adhesive 80 is disposed in the peripheral region 120, and the wire 91 only pass through the peripheral region 120. Compared with the case where the conductive adhesive is disposed in the peripheral region 130 or 140 and the wire 91 pass through the peripheral region 130 or 140 and the peripheral region 120, this can effectively shorten the length of the wire. In addition, in the embodiment of the present disclosure, the conductive adhesive 80 is disposed on the side of the first substrate on which the printed circuit board 60 is disposed, so the first substrate provided with the conductive adhesive can adopt the GOA mode (as shown in FIG. 1A), the COF mode (as shown in FIG. 1B) and the like. Therefore, it has a better compatibility.

Figure 3A:
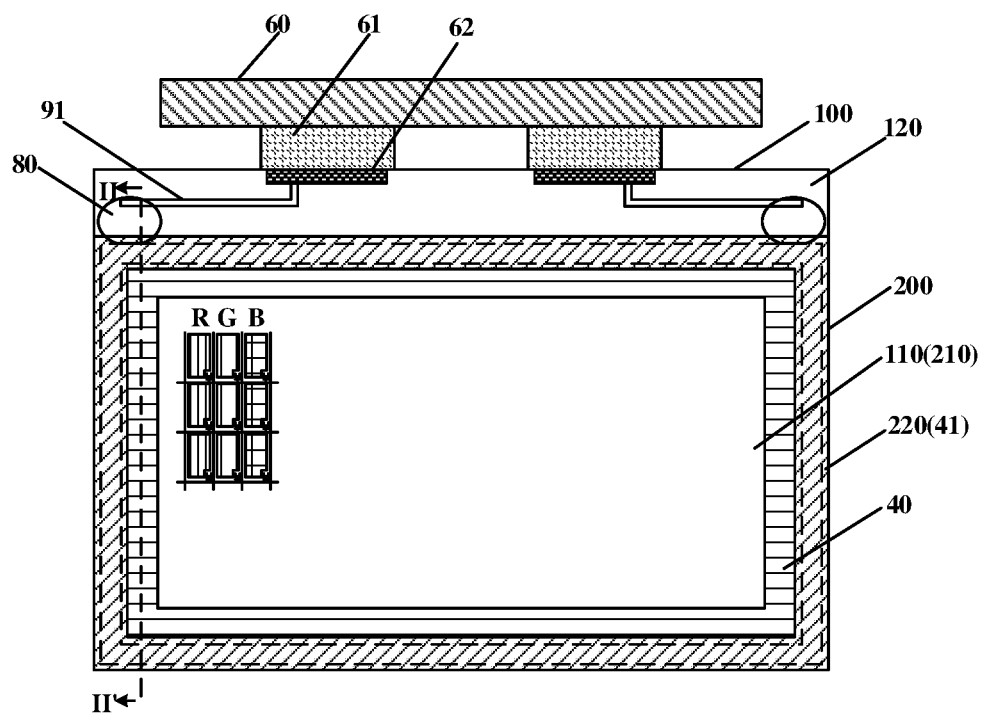
FIG. 3A is a schematic top view corresponding to FIG. 1A with the presence of a sealant.
Figure 3B:
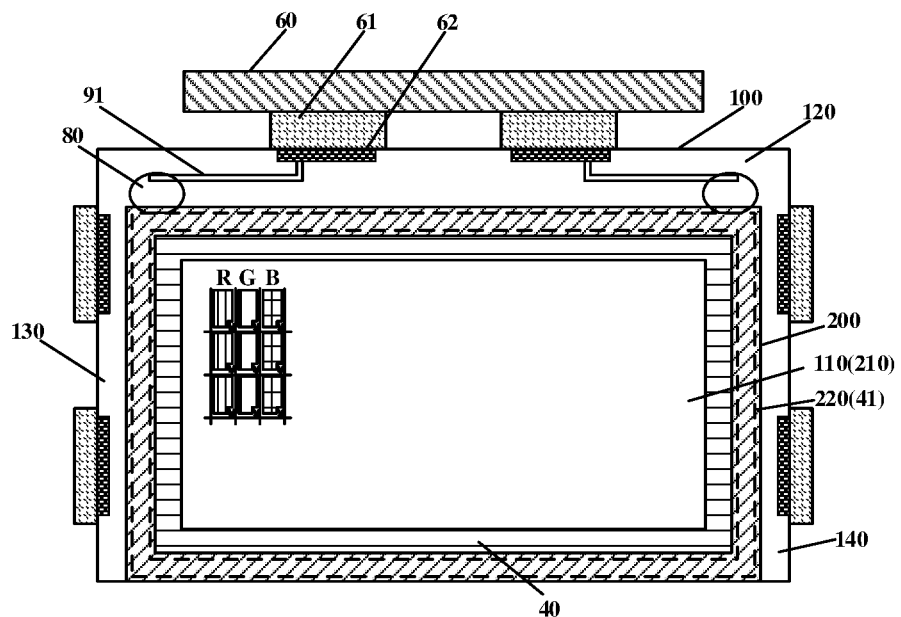
FIG. 3B is a schematic top view corresponding to FIG. 1B with a presence of a sealant.
Figure 4:
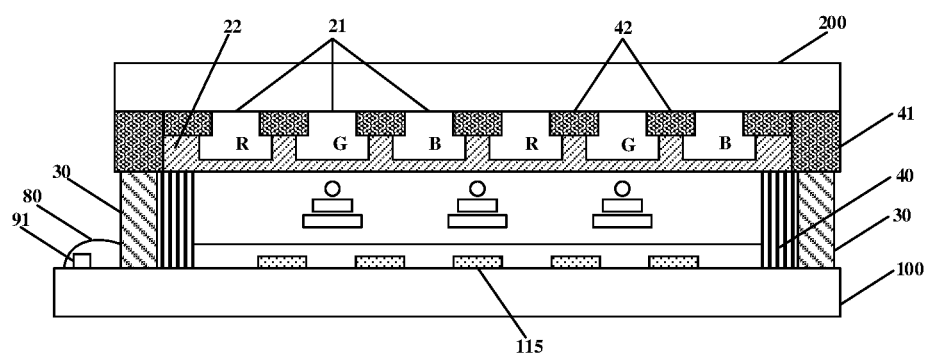
FIG. 4 is a cross-sectional view taken along line II-II' of FIG. 3A.

For example, the display panel provided in this embodiment can further include a sealant 40, as shown in FIG. 3A, FIG. 3B and FIG. 4 (FIG. 3A is a schematic top view of FIG. 1A with a sealant, FIG. 3B is a schematic top view of FIG. 1B with a sealant, and FIG. 4 is a cross-sectional view taken along line II-II' of FIG. 3A). The sealant 40 can be disposed on the outer side of the display region 110 of the first substrate 100 and forms an enclosed shape, for example, on a side of the conduction section 30 facing the display region 110. The sealant 40 can be used for sealing a liquid crystal cell to prevent the liquid crystal overflow and moisture intrusion, maintaining the thickness of the liquid crystal cell, and adhering the first substrate and the second substrate, so the thickness of the sealant 40 is the thickness of a gap between the first substrate 100 and the second 200 to achieve the above effects. In addition, in order to avoid a peeling-off problem, the width of the conduction section 30 can be designed to be less than 50 μm, so that the width of the sealant 40 is less affected, and the peeling of the display panel can be well avoided.

In the embodiment of the present disclosure, the conduction section is disposed in the peripheral region of the first substrate, the conduction section is electrically connected with the black matrix of the second substrate, and the conduction section is further electrically connected with the grounded section, so that the static electricity accumulated on the black matrix layer can be discharged, thereby preventing the static electricity from affecting the display effect of the display panel or even damaging the display panel.

An embodiment of the present disclosure further provides a display panel, and this display panel differs from the display panel provided in the above embodiment in the method of disposing the conduction section 30.

In one example of the embodiment of the present disclosure, as shown in FIG. 6A, FIG. 6B, FIG. 7A, FIG. 7B, FIG. 8A and FIG. 8B, a gate electrode 71, a gate insulating layer 77, an active layer 72 and source/drain electrodes 73, 74 of a thin film transistor, a passivation layer 78 and a pixel electrode 75 can be sequentially disposed on a base substrate of the first substrate, and the pixel electrode 75 is electrically connected with the drain electrode 74 of the thin film transistor through a via hole in the passivation layer 78.

For example, as shown in FIG. 6A, FIG. 6B, FIG. 7A, FIG. 7B, FIG. 8A and FIG. 8B, the first conductive layer 310 can be disposed in a same layer as an electrode in the display region of the first substrate. In this way, the first conductive layer 310 of the conduction section 30 can be formed while forming the electrode in the display region of the first substrate by a gray mask process, thereby omitting a patterning process required to form the first conductive layer 310 separately, and reducing the process flow.

The thin film transistor is disposed in the display region of the first substrate, and the thin film transistor includes the gate electrode 71, the active layer 72, the source electrode 73 and the drain electrode 74. Because the gate electrode 71 and the source/drain electrodes 73, 74 are made of a metal such as aluminum, copper, molybdenum or the like, and the electrical resistance of the metal is small. For example, as shown in FIG. 6A, FIG. 6B, FIG. 8A and FIG. 8B, the first conductive layer 310 of the conduction section 30 can be disposed in a same layer as the gate electrode 71. For another example, as shown in FIG. 7A and FIG. 7B, the first conductive layer 310 can be disposed in a same layer as the source/drain electrodes 73, 74. For another example, as shown in FIG. 7A and FIG. 7B, two first conductive layers are disposed, which are respectively disposed in a same layer as the gate electrode 71 and the source/drain electrodes 73, 74, that is, the conductive layer in the display region of the first substrate is a layer where the gate electrode or source/drain electrode is located.

It should be noted that, depending on the position of the gate electrode, the thin film transistor can be classified into a top gate type (that is, the gate electrode 71 is located on a side of the active layer 72 away from the base substrate) and a bottom gate type (that is, the gate electrode 71 is located on a side of the active layer 72 facing the base substrate, as shown in FIG. 6A, FIG. 6B, FIG. 7A, FIG. 7B, FIG. 8A and FIG. 8B). Depending on how the source/drain electrodes 73, 74 are in contact with the active layer 72, the thin film transistor can be classified into a top contact type (that is, the source/drain electrodes 73, 74 are located on the side of the active layer 72 away from the base substrate, as shown in FIG. 6A, FIG. 6B, FIG. 7A, FIG. 7B, FIG. 8A and FIG. 8B) and a bottom contact type (that is, the source/drain electrodes 73, 74 are located on the side of the active layer 72 facing the base substrate 10). In the embodiment of the present disclosure, the structure of the thin film transistor is not limited to the above. For example, when the thin film transistor is of a top gate type, the first conductive layer 310 of the conduction section 30 can still be disposed in a same layer as the gate electrode or the source/drain electrodes. The following embodiments are mainly described by taking the bottom gate type as an example.

In addition, a gate signal line in the first substrate is connected with the gate electrode, and a data signal line is connected with one of the source/drain electrodes. Therefore, the first conductive layer 310, the gate electrode 71 and the gate signal line can be formed in a same patterning process. Alternatively, the first conductive layer 310, the source/drain electrodes 73, 74 and the data signal line can be formed in a same patterning process.

In another example of the embodiment of the present disclosure, as shown in FIG. 6A, FIG. 6B, FIG. 7A, FIG. 7B, FIG. 8A and FIG. 8B, the conduction section 30 can further include an insulating layer 330 covering the first conductive layer 310 and a second conductive layer 320. The second conductive layer 320 is electrically connected with the first conductive layer 310 through at least one via hole 33 in the insulating layer 330, and the second conductive layer 320 is electrically connected with the black matrix 41. The number of the via hole 33 can be set as needed, as long as the second conductive layer can be electrically connected with the first conductive layer, and the embodiment of the present disclosure is not limited to this.

Figure 6A:
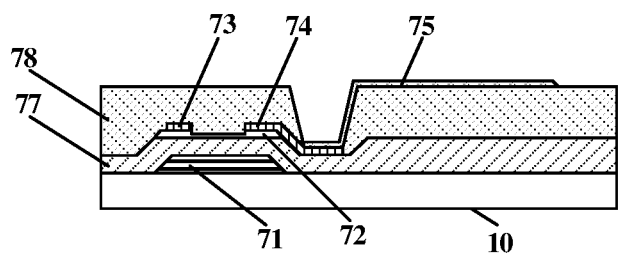
FIG. 6A is a schematic cross-sectional view of a display region of a first substrate in a display panel according to an embodiment of the present disclosure.
Figure 6B:
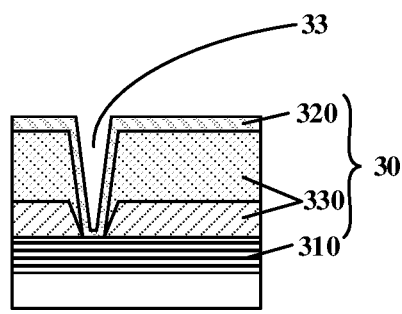
FIG. 6B is a schematic cross-sectional view of a peripheral region of a first substrate in a display panel according to an embodiment of the present disclosure.
Figure 7A:
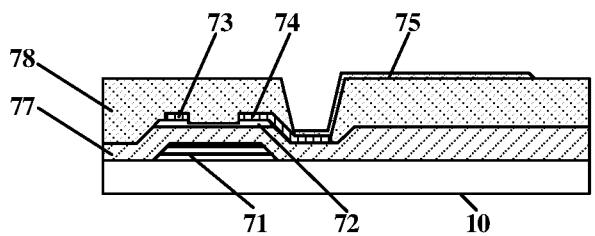
FIG. 7A is a schematic cross-sectional view of a display region of another first substrate in a display panel according to an embodiment of the present disclosure.
Figure 7B:
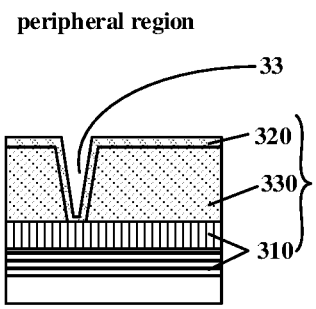
FIG. 7B is a schematic cross-sectional view of a peripheral region of another first substrate in a display panel according to an embodiment of the present disclosure.

For example, as shown in FIG. 6A and FIG. 6B, the insulating layer 330 can be formed by using a material of the gate insulating layer 77 or the passivation layer 78 in the display region of the first substrate. As shown in FIG. 6A and FIG. 6B, after the first conductive layer 310 of the conduction section 30 is formed by a gate metal layer forming the gate electrode 71, in a process of forming the gate insulating layer 77, the material of the gate insulating layer is allowed to cover the first conductive layer 310 simultaneously in the peripheral region of the first substrate. In a process of forming the active layer 72 on the gate insulating layer 77, the material of the active layer on the first conductive layer 310 on which the gate insulating layer material is formed is etched away. In a process of forming the source/drain electrodes 73, 74 on the active layer 72, the source/drain metal layer formed on the first conductive layer 310 is etched away. In a process of forming the passivation layer 78 and via holes of the passivation layer on the source/drain electrode, the material of the passivation layer is allowed to cover the first conductive layer 310 on which the gate insulating layer material is formed and form the via hole 33, thereby forming the insulating layer 330 of the conduction section 30 and the via hole 33 in the insulating layer 330. In this case, the via hole 33 penetrates the material of the gate insulating layer and the material of the passivation layer to expose a partial region of the first conductive layer 310, thereby enabling the second conductive layer 320 to electrically connected with the first conductive layer 310.

It should be noted that, depending on an actual situation, the insulating layer 330 is not limited to the case of being formed by using the material of the gate insulating layer 77 and the passivation layer 78 in the display region of the first substrate.

For example, as shown in FIG. 7A and FIG. 7B, when the first conductive layer 310 is disposed in a same layer as the source/drain electrodes 73, 74, the insulating layer 330 can also be formed by using only the material of the passivation layer 78 in the display region of the first substrate.

In one example of an embodiment of the present disclosure, as shown in FIG. 6A and FIG. 6B, FIG. 7A and FIG. 7B, the second conductive layer 320 of the conduction section 30 can be disposed in a same layer as the pixel electrode 75 in the display region of the first substrate. Thus, in a process of forming the pixel electrode 75 on the passivation layer 78, the pixel electrode 75 and the second conductive layer 320 in the peripheral region of the first substrate can be simultaneously formed by same one patterning process.

Figure 8A:
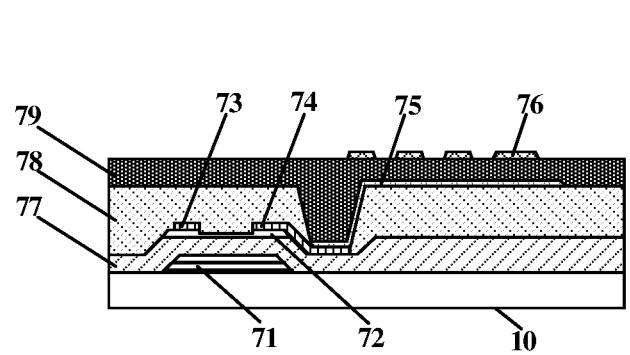
FIG. 8A is a schematic cross-sectional view of a display region of another first substrate in a display panel according to an embodiment of the present disclosure.
Figure 8B:
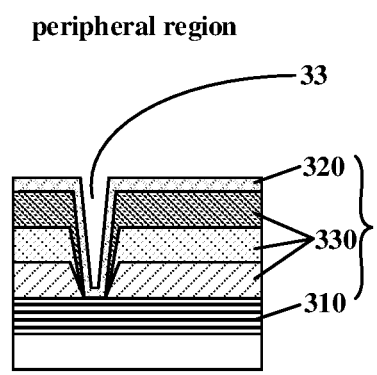
FIG. 8B is a schematic cross-sectional view of a peripheral region of another first substrate in a display panel according to an embodiment of the present disclosure.

In addition, as shown in FIG. 8A and FIG. 8B, for a display panel adopting a horizontal electric field mode, a common electrode 76 can be further disposed in the first substrate. Therefore, in this case, the second conductive layer 320 can also be disposed in a same layer as the common electrode 76.

FIG. 8A and FIG. 8B are an example in which the pixel electrode 75 is located between the common electrode 76 and the base substrate. In this case, in a process of forming the pixel electrode 75 on the passivation layer 78, the pixel electrode layer formed in the peripheral region of the first substrate can be etched away. In a process of forming the insulating layer 79 between the pixel electrode 75 and the common electrode 76, the portion of the insulating layer 79 corresponding to the via hole 33 in the insulating layer 330 is subjected to a via forming process to expose a portion of the first conductive layer 310. In a process of forming the common electrode 76 over the insulating layer 79, the common electrode 76 and the second conductive layer 320 in the peripheral region of the first substrate can be simultaneously formed by using same one patterning process, thereby enabling the second conductive layer 320 to be electrically connected with the first conductive layer 310.

In the embodiment of the present disclosure, the pixel electrode 75 and the common electrode 76 are transparent electrodes, and they are usually made of a transparent metal oxide such as ITO (Indium Tin Oxide) or the like.

It should be noted that, when forming film the various layers in the display region of the first substrate, the layers of the conduction section are simultaneously formed in the peripheral regions of the first substrate, and each layer is formed by adopting a gray mask process. In a same layer, the thickness of the conduction section disposed in the peripheral region of the first substrate is greater than the thickness of the conduction section disposed in the display region of the first substrate, so the conduction section can be processed more easily to form a desired thickness, thereby implementing the electrical connection between the black matrix and the conduction section.

In addition, the embodiments of the present disclosure have no limitation on the positional relationship of the pixel electrode 75 and the common electrode 76 in the array substrate. For example, as shown in FIG. 8A and FIG. 8B, the pixel electrode 75 can be located on a side of the common electrode 76 facing the base substrate 10. For another example, the pixel electrode 75 can also be located on a side of the common electrode 76 away from the base substrate 10.

In addition, for an OLED display panel, the first conductive layer of the conduction section can also be formed simultaneously with the gate electrode or source/drain electrodes of the thin film transistor included in the first substrate (that is, disposed in a same layer), and the insulating layer covering the first conductive layer can also be formed by using a gate insulating layer and a passivation layer of a thin film transistor. Of course, depending on the actual situation, the first conductive layer and the insulating layer covering the first conductive layer can also be formed by using other conductive structures or insulating layers on the first substrate in the OLED display panel. Accordingly, the second conductive layer can be formed by using a transparent conductive layer on the first substrate in the OLED display panel.

In some embodiment of the present disclosure, the conduction section further includes the insulating layer and the second conductive layer in addition to the first conductive layer, and the layer structure of the conduction section can be disposed in a same layer as a corresponding layer in the display region of the first substrate by using same one patterning process. For example, a gray mask process can be adopted, the thickness of the layer formed in the peripheral region of the first substrate is greater than the thickness of the corresponding layer in the display region of the first substrate, so that the processing of the conduction section is more easily performed, enabling the conduction section to possess a certain thickness, thereby implementing the electrical connection with the black matrix to release the static electricity accumulated on the black matrix layer.

An embodiment of the present disclosure further provides a display panel, which is different from the above embodiments in that the conduction section is disposed around the peripheral region of the first substrate and forms an enclosed shape, the black matrix disposed in the peripheral region of the second substrate also forms an enclosed shape, and the conduction section is in contact with the black matrix. For example, as shown in FIG. 4, the black matrix is also disposed in the display region of the second substrate, as indicated by the reference numeral 42 in FIG. 4, and the thickness of the black matrix 41 disposed in the peripheral region of the second substrate is greater than that the thickness of the black matrix 42 disposed in the display region of the second substrate. The black matrix 42 disposed in the display region 210 of the second substrate 200 can be used to block the scattered light of the liquid crystal layer, prevent color cross-talk between sub-pixels, and prevent ambient light from illuminating the TFT channel.

For example, the black matrix 41 disposed in the peripheral region of the second substrate and the black matrix 42 disposed in the display region of the second substrate can be formed by using same one patterning process such as a gray mask process, enabling the thickness of the black matrix 41 disposed in the peripheral region of the second substrate to be greater than that the thickness of the black matrix 42 disposed in the display region of the second substrate by using a specific mask pattern.

For example, as shown in FIG. 4, the second substrate further includes a planarization layer 22 disposed in the display region of the second substrate, the planarization layer 22 covers the black matrix 42 in the display region of the second substrate, and the thickness of the black matrix 41 disposed in the peripheral region of the second substrate is equal to the sum of the thickness of the black matrix 42 disposed in the display region of the second substrate and the thickness of the planarization layer 22.

Figure 5:
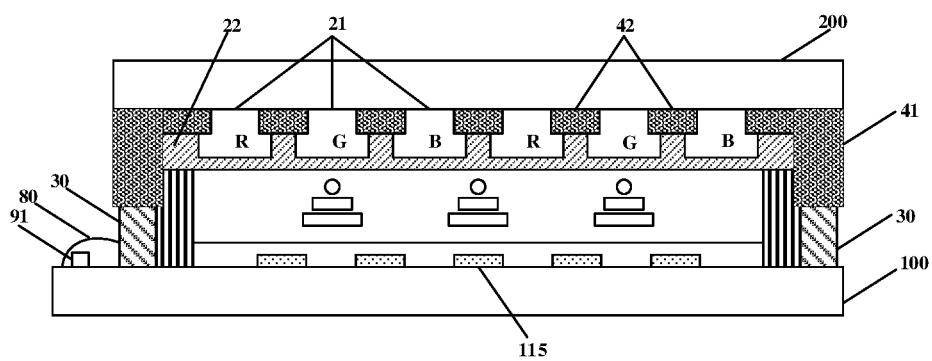
FIG. 5 is a schematic view showing a manner of setting a thickness of a black matrix and a conduction section.

It should be noted that, regarding the manner of setting the thickness of the black matrix 41 and the conduction section 30, the embodiments of the present disclosure include but are not limited the above. For example, as shown in FIG. 5, the thickness of the black matrix 41 disposed in the peripheral region of the second substrate can also be greater than the sum of the thickness of the black matrix 42 disposed in the display region of the second substrate and the thickness of the planarization layer 22. Accordingly, the thickness of the conduction section 30 is ensured to be in contact with the black matrix 41.

As the above embodiments, the conduction section is electrically connected with the black matrix, and the conduction section is further electrically connected with the grounded section, so that the static electricity accumulated by the black matrix layer can be released, thereby preventing the static electricity from affecting the display effect of the display panel or even damaging the display panel. In addition, the conduction section is disposed around the peripheral region of the first substrate and forms an enclosed shape, a portion of the black matrix disposed in the peripheral region of the second substrate also forms an enclosed shape, and the conduction section is in contact with the black matrix. This is equivalent to wrapping the panel entirely inside with the conduction section and the black matrix, and the static electricity that is about to enter the gap between the first substrate and the second substrate can be released, thereby achieving the effect of electrostatic shielding.

It should be noted that, in the case of no conflict, the features described in the above embodiments can be combined with each other to obtain a new embodiment.

An embodiment of the present disclosure further provides a display apparatus, and the display apparatus includes the display panel provided by any of the above embodiments. For example, the display apparatus is a liquid crystal display apparatus, which can further include a backlight for providing a light source to the display panel, and include polarizers on both sides of the display panel. The display apparatus can also be an OLED display apparatus. The display apparatus provided by the embodiment of the present disclosure can further include a touch electrode structure, such as a Full In-Cell (FIC) capacitive touch screen, and the touch electrode structure is formed within, for example, a liquid crystal cell or an OLED package. The display apparatus provided by the embodiment of the present disclosure can improve the electrostatic discharge effect, thereby preventing the static electricity from affecting the display effect and the touch effect.

For example, the display apparatus provided by the embodiment of the present disclosure can be a liquid crystal panel, an electronic paper, an OLED panel, a touch panel, a mobile phone, a tablet computer, a television, a display, a notebook computer, a digital photo frame, a navigator and other products or members having display function.

Figure 9:
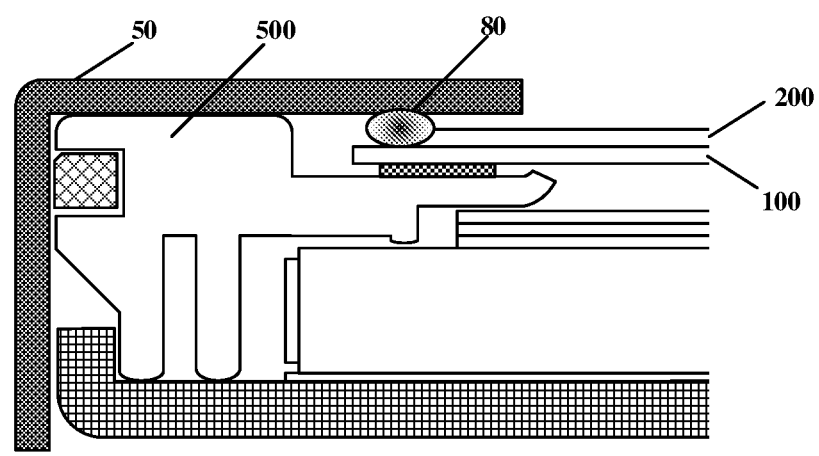
FIG. 9 is a schematic structural view of a conductive adhesive in contact with a surface of a metal frame according to an embodiment of the present disclosure.

The display apparatus provided by the embodiment of the present disclosure can further include a metal frame. When the display panel is encapsulated with a metal frame, the grounded section can also be the metal frame. FIG. 9 is a schematic structural view of a conductive adhesive in contact with a surface of a metal frame according to an embodiment of the present disclosure. As shown in FIG. 9, the first substrate 100 and the second substrate 200 are fixed by a holder 500 and the metal frame 50 after the cell process. By controlling the amount of the conductive adhesive dropped onto the first substrate 100, the conductive adhesive 80 can contact with the surface of the metal frame 50, thereby implementing the electrical connection between the conductive adhesive 80 and the metal frame 50. Because the conductive adhesive is connected with the conduction section, and the conduction section is electrically connected with the black matrix, thereby allowing the static electricity on the black matrix to be discharged to the metal frame 50.

It should be noted that FIG. 9 only exemplarily shows the situation after the conductive adhesive is dropped, and the shape of the conductive adhesive does not reflect its true scale.

The technical effects of the display apparatus provided by the embodiment of the present disclosure are consistent with the technical effects of the display panel provided by the above embodiment, that is, the static electricity accumulated by the black matrix layer can be released, thereby preventing the static electricity from affecting a display effect of the display panel or even damaging the display panel. In addition, the static electricity that is about to enter the gap between the first substrate and the second substrate can be released, thereby achieving an effect of electrostatic shielding.

The embodiment of the present disclosure further provides a method of manufacturing a display panel. For example, the method includes: providing a first substrate; and providing a second substrate and positioning the second substrate opposite to the first substrate. The first substrate includes a display region and a peripheral region, a conduction section is in the peripheral region of the first substrate, and the conduction section is electrically connected with a grounded section. The second substrate includes a display region and a peripheral region, a black matrix is at least in the peripheral area of the second substrate, and the black matrix is electrically connected with the conduction section.

For example, in one example, the method include the following steps:

Step 110, providing the first substrate, forming the conduction section in the peripheral region of the first substrate, and making the conduction section to be electrically connected with the grounded section;

Step 120, providing the second substrate, and forming the black matrix in the peripheral region of the second substrate;

Step 130, performing a cell process for the first substrate and the second substrate and making the conduction section to be contact with the black matrix, thereby implementing an electrical connection between the conduction section and the black matrix.

For example, the first substrate can be an array substrate, and the step 110 further includes other conventional process steps in an array manufacturing process, for example, the step 110 further includes forming layer structures of the TFTs in the display region of the array substrate.

For example, the second substrate can be a color film substrate, and the step 120 further includes other conventional process steps in a color film manufacturing process, for example, the step 120 further includes forming a color filter layer, a planarization layer of the color film substrate and the like.

Before the step 130, the method further includes other conventional process steps in the liquid crystal cell manufacturing process, for example, the method further includes process steps such as liquid crystal dropping, sealant coating and the like.

For a detailed description of the conduction section, the black matrix and the grounded section in this embodiment, reference can be made to the corresponding description in the foregoing embodiments, and details are not described here again.

It should be noted that, in the drawings of the present disclosure, the size and shape of each film layer do not reflect the true scale, and the purpose is to schematically explain the basic structure and shape of each film layer of the display panel in the embodiment of the present disclosure.

What have been described above are only specific implementations of the present disclosure, the protection scope of the present disclosure is not limited thereto. The protection scope of the present disclosure should be based on the protection scope of the claims.

What is claimed is:

1. A display panel, comprising:
   a first substrate and a second substrate, arranged opposite to each other, wherein the first substrate comprises a display region and a peripheral region, a conduction section is in the peripheral region of the first substrate, and the conduction section is electrically connected with a grounded section; and the second substrate comprises a display region and a peripheral region, wherein a black matrix is at least in the peripheral region of the second substrate, and the black matrix is electrically connected with the conduction section, wherein the conduction section comprises at least one first conductive layer, and the at least one first conductive layer is respectively in a same layer as a conductive layer in the display region of the first substrate, wherein the conductive layer in the display region of the first substrate comprises a light shielding layer, and the first conductive layer is in a same layer as the light shielding layer.

2. The display panel according to claim 1, wherein a thickness of the first conductive layer in the peripheral region of the first substrate is greater than a thickness of a conductive layer, which is in a same layer as the first conductive layer, in the display region of the first substrate, and the first conductive layer is electrically connected with the black matrix.

3. The display panel according to claim 1, wherein the black matrix is further in the display region of the second substrate, and a thickness of the black matrix in the peripheral region of the second substrate is greater than a thickness of the black matrix in the display region of the second substrate.

4. The display panel according to claim 3, wherein the conduction section is around the peripheral region of the first substrate and forms an enclosed shape, a portion of the black matrix in the peripheral region of the second substrate forms another enclosed shape, and the conduction section is in contact with the black matrix.

5. The display panel according to claim 4, wherein the second substrate further comprises a planarization layer in the display region of the second substrate, the planarization layer covers the black matrix in the display region of the second substrate, and the thickness of the black matrix in the peripheral region of the second substrate is equal to a sum of the thickness of the black matrix in the display region of the second substrate and a thickness of the planarization layer.

6. The display panel according to claim 1, further comprising a sealant, wherein the sealant is on a side of the conduction section facing the display region of the first substrate.

7. The display panel according to claim 1, further comprising a conductive adhesive, wherein the conduction section is electrically connected with the grounded section via the conductive adhesive.

8. The display panel according to claim 1, wherein the display panel is a fully embedded capacitive touch screen.

9. A display apparatus, comprising the display panel according to claim 1.

10. The display apparatus according to claim 9, further comprising a metal frame, wherein the grounded section comprises the metal frame.

11. A manufacture method of a display panel, comprising:
providing a first substrate; and providing a second substrate and positioning the second substrate opposite to the first substrate, wherein the first substrate comprises a display region and a peripheral region, a conduction section is in the peripheral region of the first substrate, and the conduction section is electrically connected with a grounded section; and the second substrate comprises a display region and a peripheral region, wherein a black matrix is at least in the peripheral area of the second substrate, and the black matrix is electrically connected with the conduction section, wherein the conduction section comprises at least one first conductive layer, and the at least one first conductive layer is respectively in a same layer as a conductive layer in the display region of the first substrate, wherein the conductive layer in the display region of the first substrate comprises a light shielding layer, and the first conductive layer is in a same layer as the light shielding layer.

12. A display panel, comprising:
a first substrate and a second substrate, arranged opposite to each other, wherein the first substrate comprises a display region and a peripheral region, a conduction section is in the peripheral region of the first substrate, and the conduction section is electrically connected with a grounded section; and the second substrate comprises a display region and a peripheral region, wherein a black matrix is at least in the peripheral region of the second substrate, and the black matrix is electrically connected with the conduction section, wherein the conduction section comprises at least one first conductive layer, and the at least one first conductive layer is respectively in a same layer as a conductive layer in the display region of the first substrate, a thin film transistor is in the display region of the first substrate, the thin film transistor comprises a gate electrode and a source/drain electrode, and the first conductive layer is in a same layer as a metal layer where the source/drain electrode is located.

13. The display panel according to claim 12, wherein the conduction section further comprises an insulating layer and a second conductive layer, the insulating layer covers the first conductive layer, the second conductive layer is electrically connected with the first conductive layer through at least one via hole in the insulating layer, and the second conductive layer is electrically connected with the black matrix.

14. The display panel according to claim 13, wherein the first substrate further comprises a pixel electrode, and the second conductive layer is in a same layer as the pixel electrode; or the first substrate further comprises a common electrode, and the second conductive layer is in a same layer as the common electrode.

15. The display panel according to claim 12, wherein the black matrix is further in the display region of the second substrate, and a thickness of the black matrix in the peripheral region of the second substrate is greater than a thickness of the black matrix in the display region of the second substrate.

16. The display panel according to claim 15, wherein the conduction section is around the peripheral region of the first substrate and forms an enclosed shape, a portion of the black matrix in the peripheral region of the second substrate forms another enclosed shape, and the conduction section is in contact with the black matrix.

17. The display panel according to claim 16, wherein the second substrate further comprises a planarization layer in the display region of the second substrate, the planarization layer covers the black matrix in the display region of the second substrate, and the thickness of the black matrix in the peripheral region of the second substrate is equal to a sum of the thickness of the black matrix in the display region of the second substrate and a thickness of the planarization layer.

18. The display panel according to claim 12, further comprising a sealant, wherein the sealant is on a side of the conduction section facing the display region of the first substrate.

19. The display panel according to claim 12, further comprising a conductive adhesive, wherein the conduction section is electrically connected with the grounded section via the conductive adhesive.

20. The display panel according to claim 12, wherein the display panel is a fully embedded capacitive touch screen.

* * * * *